(12) United States Patent
Deng et al.

(10) Patent No.: US 7,356,057 B2
(45) Date of Patent: Apr. 8, 2008

(54) WIDE TEMPERATURE RANGE VERTICAL CAVITY SURFACE EMITTING LASER

(75) Inventors: Qing Deng, Cupertino, CA (US); Ruldolf J. Hofmeister, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 125 days.

(21) Appl. No.: 10/695,057

(22) Filed: Oct. 28, 2003

(65) Prior Publication Data

US 2004/0228377 A1 Nov. 18, 2004

Related U.S. Application Data

(60) Provisional application No. 60/422,741, filed on Oct. 31, 2002.

(51) Int. Cl.
*H01S 3/04* (2006.01)
(52) U.S. Cl. .............................. 372/34; 372/36; 372/35
(58) Field of Classification Search .................. 372/34, 372/35, 36
See application file for complete search history.

(56) References Cited

U.S. PATENT DOCUMENTS

| | | | | |
|---|---|---|---|---|
| 5,740,191 | A | 4/1998 | Kasper et al. ................. | 372/34 |
| 6,822,984 | B2 * | 11/2004 | Ono et al. ................ | 372/29.02 |
| 2003/0033819 | A1 * | 2/2003 | Prescott ......................... | 62/3.7 |

OTHER PUBLICATIONS

Article entitled "High-Power Temperature-Insensitive Gain-Offset InGaAs / GaAs Vertical-Cavity Surface-Emitting Lasers", dated Feb. 1993, IEEE Photonics Technology Letters Engineering Periodical, vol. 5, No. 2, pp. 129-132, by D.B. Young, J.W. Scott, B.J. Thibeault, S.W. Corzine, M.G. Peters, S.L. Lee and L.A. Coldren.
Article entitled "Enhanced Performance of Offset-Gain High-Barrier Vertical-Cavity Surface-Emitting Lasers", dated Jun. 1993, IEEE Journal of Quantum Electronics, vol. 29, No. 6, pp. 2013-2022, by D.B. Young, J.W. Scott, F.H. Peters, M.G. Peters, M.L. Majewski, B.J. Thibeault, Scott W. Corzine, and Larry A. Coldren.
Article entitled "Highly Efficient Vertical-Cavity Surface-Emitting Lasers Optimized for Low-Temperature Operation", dated Aug. 1995, IEEE Photonics Technology Letters, vol. 7, No. 8, pp. 851-853, by E. Goobar, M.G. Peters, G. Fish, and L.A. Coldren.

(Continued)

*Primary Examiner*—Minsun Oh Harvey
*Assistant Examiner*—Tod T. Van Roy
(74) *Attorney, Agent, or Firm*—Workman Nydegger

(57) ABSTRACT

A vertical cavity surface emitting laser (VCSEL) module that is configured to operate in a wide temperature range without severely minimizing its lifetime or requiring excessive drive current. The VCSEL portion of the VCSEL module is tuned to operate efficiently at a higher than normal temperature. In addition to the VCSEL, the VCSEL module includes a heater and a temperature sensor that are used to maintain a particular minimum temperature that is within the efficient operation range of the VCSEL. By maintaining a temperature that is within the efficient operation range, the VCSEL module reduces the current required to operate the VCSEL and extends the overall lifetime of the VCSEL. The additional components of the VCSEL module do not interfere in any way with the signal quality produced by the VCSEL.

8 Claims, 3 Drawing Sheets

OTHER PUBLICATIONS

Article entitled "Low-Temperature (10-300 K) Characterization of MOVPE-Grown Vertical-Cavity Surface-Emitting Lasers", dated Oct. 1995, IEEE Photonics Technology Letters, vol. 7, No. 10, pp. 1110-1112, by L.A. Hornak, J.C. Barr, W.D. Cox, K.S. Brown, R.A. Morgank and M.K. Hibbs-Brenner.

Article entitled Cryogenic Operation of AlGaAs-GaAs Vertical-Cavity Surface-Emitting Lasers at Temperatures from 200 K to 6 K, dated Mar. 1996, IEEE Photonics Technology Letters, vol. 8, No. 3, pp. 316-318, by G. Goncher, Bo Lu, Wen-Lin Luo, Julian Cheng, S. Hersee, S.Z. Sun, R.P. Schneider, and J.C. Zolper.

Article entitled "Temperature Sensitivity of 1.54 μm Vertical-Cavity Lasers with an InP-Based Bragg Reflector", dated Oct. 1997, IEEE Journal of quantum Electronics, vol. 33, No. 10, pp. 1839-1845, by Stefan Rapp, Joachim Piprek, Klaus Streubel, Janos Andre and J. Wallin.

* cited by examiner

WIDE TEMPERATURE RANGE VERTICAL CAVITY SURFACE EMITTING LASER

CROSS-REFERENCE TO RELATED APPLICATIONS

This application claims priority to U.S. Provisional Application Ser. No. 60/422,741, filed Oct. 31, 2002 and entitled "WIDE TEMPERATURE RANGE VERTICAL CAVITY SURFACE EMITTING LASER," which application is incorporated herein by reference in its entirety.

BACKGROUND OF THE INVENTION

1. The Field of the Invention

The present invention relates to semiconductor lasers. More particularly, the present invention relates to a vertical cavity surface emitting laser that is configured to operate in a wide temperature range.

2. Background and Relevant Art

One of the light sources used in optical communication systems is a vertical cavity surface emitting laser (VCSEL). VCSELs are popular in part because they can be manufactured in large quantities due to their relatively small size and can be tested in wafer form. VCSELs typically have low threshold currents and can be modulated at high speeds. VCSELs also couple well to optical fibers.

In a VCSEL, the light or optical signal being amplified resonates in a direction that is perpendicular to the pn-junction. The cavity or active region of a VCSEL is thus relatively short and a photon has a small chance of stimulating the emission of an additional photon with a single pass through the active region. To increase the likelihood of stimulating the emission of photons, VCSELs require highly efficient mirror systems such that a photon can make multiple passes through the active region. The reflectivity requirement of VCSELs cannot easily be achieved with metallic mirrors.

VCSELs thus employ Distributed Bragg Reflector (DBR) layers as mirrors. The semiconductor materials or dielectric materials used in DBR layers are grown or formed such that each layer has a refractive index that is different from the refractive index of adjoining layers. The junctions between the DBR layers that are grown in this fashion cause light to be reflected. The amount of light reflected, however, by a single junction is relatively small and is often dependent on the variance between the relative refractive indices of the adjoining materials. For this reason, a relatively large number of DBR layers are formed in a VCSEL in order to achieve high reflectivity. VCSELs, for example, often have on the order of 50 to 100 DBR layers in order to achieve sufficient reflectivity.

Even though forming a large number of DBR layers can be a difficult task, VCSELs are attractive for various low power and/or multi-transverse mode applications because they are easy to test, have a good beam profile and typically have low power consumption. These attributes also make VCSELs unattractive for other applications, such as those that require more power in a single mode. For example, high power pump lasers are required for erbium doped fiber amplifiers. The power supplied by the pump lasers should be delivered in a single mode in order to avoid excessive noise. Current VCSELs are not suitable for this application because single mode VCSELs do not produce sufficient power. Those VCSELs that do produce sufficient power introduce excessive noise because more than one mode is generated. As a result, higher cost edge emitting lasers are often used for these applications.

VCSELs are also limited to a relatively narrow operational temperature range meaning that VCSELs cannot be used in environments that experience wide ranges of temperatures. VCSELs are often said to be tuned to a particular temperature at which the threshold current required to operate the laser is minimized. The further the temperature is away from the particular tuned temperature, the more current is required to operate the laser. After the temperature drifts a certain amount away from the tuned temperature it is no longer possible to drive the laser because the current requirement is so high. In addition to requiring excessive current, the lifetime of the laser is also shortened in a logarithmic manner when the VCSEL is operated away from the particular tuned temperature. The following equation illustrates the mathematical relationship between the drive current of the VCSEL and the mean lifetime of the VCSEL: $MTTF \alpha I^{-n} e^{(-fa/KTj)}$. MTTF=Mean time to failure, I=Drive current, fa=activation energy, Tj=Junction temperature. As illustrated in the equation, it is undesirable to operate a VCSEL at a high drive current or threshold current because of the significant negative affect it has on the lifetime of the VCSEL. Because of this problem, a VCSEL can only be efficiently used in an environment where the temperature is controlled within a narrow range.

Therefore there is a need in the industry for a VCSEL module that is configured to operate in a wide temperature range without severely minimizing it's lifetime or requiring excessive drive current. The module should be easy to manufacture and not degrade the signal quality produced by the VCSEL in any manner.

BRIEF SUMMARY OF THE INVENTION

These and other problems in the prior art are addressed by embodiments of the present invention, which relates to a VCSEL module that is configured to operate in a wide temperature range without severely minimizing it's lifetime or requiring excessive drive current. The VCSEL portion of the VCSEL module is tuned to operate efficiently at a higher than normal temperature. In addition to the VCSEL, the VCSEL module includes a heater and a temperature sensor that are used to maintain a particular minimum temperature that is within the efficient operation range of the VCSEL. By maintaining a temperature that is within the efficient operation range, the VCSEL module reduces the current required to operate the VCSEL and extends the overall lifetime of the VCSEL. The additional components of the VCSEL module do not interfere in any way with the signal quality produced by the VCSEL.

One embodiment of the present invention pertains to a VCSEL module that is configured to operate over a wide temperature range. The VCSEL module includes a VCSEL, a heater, a sensor, a control module and a power supply. The VCSEL is tuned to specifically operate at high temperatures. The tuning of the VCSEL involves adjusting the thickness and composition of both the reflective layers and the active layer or region. The heater is configured and positioned to increase the temperature in response to power from the power supply. The sensor is configured to sense when the temperature drops below or above a particular value. When the temperature does drop below the particular value, the control module powers the heater such that the temperature increases. Likewise, when the temperature goes above the particular value, the control module turns off the heater. The control module also independently controls the amount of current transferred into the VCSEL from the power supply in order to drive the VCSEL. Therefore, by counter intuitively tuning the VCSEL to operate at high temperatures and using a heater to maintain the efficient high temperatures, the VCSEL module operates over a wider range of temperature.

The VCSEL module has advantages over conventional VCSELs in that it can operate over a wide range of temperatures. This allows the VCSEL module to be used in environments that do not have regulated temperatures such as outside or in a non-temperature regulated building. In addition the VCSEL module could be used to replace existing VCSELs to provide additional safeguards over data integrity. For example, in an optical networking environment a VCSEL may be used in order to convert electrical data signals into optical data signals. If the VCSEL is positioned in a temperature regulated building that occasionally shuts down the heating and cooling, there is a potential for the performance of the VCSEL to be affected. Likewise, if any electrical or optical components near the VCSEL malfunction and produce excess heat there is a potential for data to be corrupted. Therefore, a VCSEL module that is configured to operate over a wide temperature range could be used to replace a standard VCSEL to provide an additional data integrity safeguard.

The foregoing, together with other features and advantages of the present invention, will become more apparent when referred to the following specification, claims and accompanying drawings.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
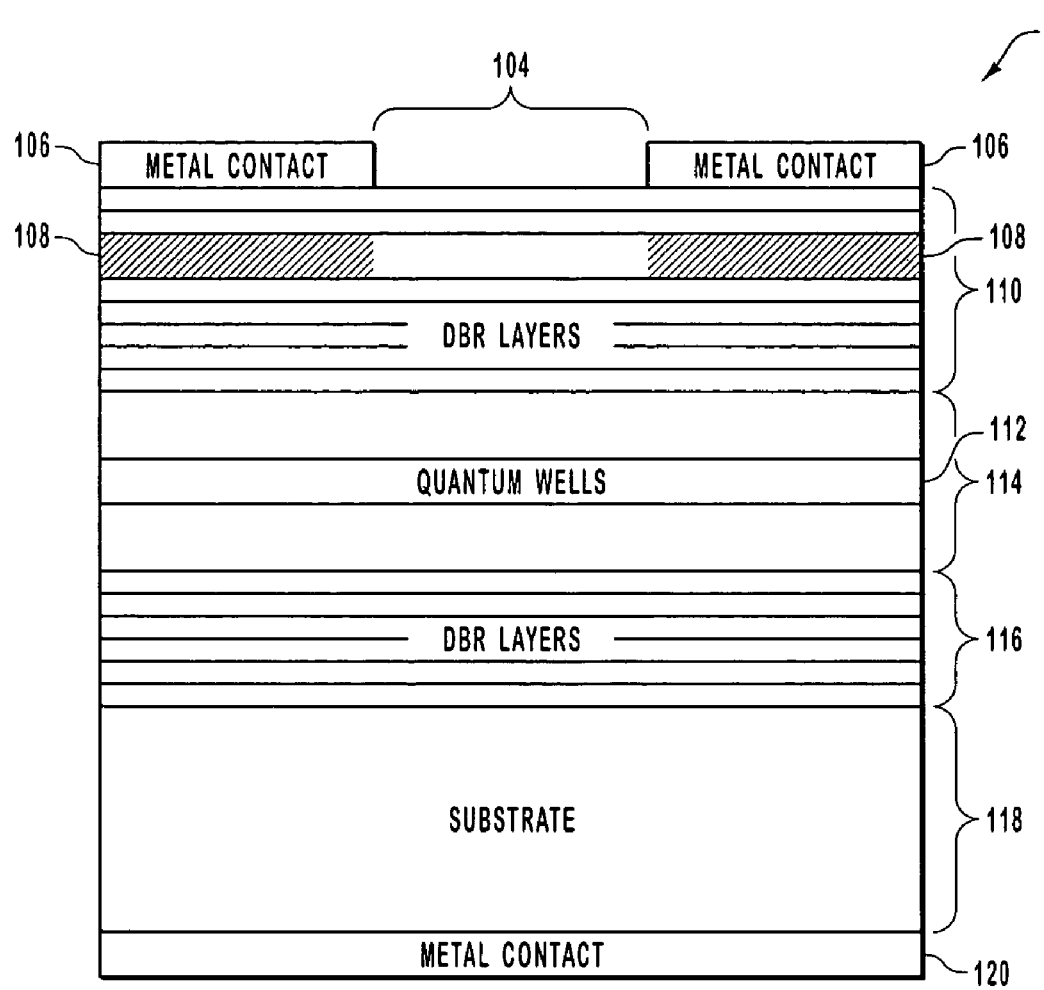
FIG. 1 illustrates an exemplary vertical cavity surface emitting laser that is used in the VCSEL module of the present invention.

Reference will now be made to the drawings to describe presently preferred embodiments of the invention. It is to be understood that the drawings are diagrammatic and schematic representations of the presently preferred embodiments, and are not limiting of the present invention, nor are they necessarily drawn to scale.

The present invention relates to a VCSEL module that is configured to operate in a wide temperature range without severely minimizing its lifetime or requiring excessive drive current. The VCSEL portion of the VCSEL module is tuned to operate efficiently at a higher than normal temperature. In addition to the VCSEL, the VCSEL module includes a heater and a temperature sensor that are used to maintain a particular minimum temperature that is within the efficient operation range of the VCSEL. By maintaining a temperature that is within the efficient operation range, the VCSEL module reduces the current required to operate the VCSEL and extends the overall lifetime of the VCSEL. The additional components of the VCSEL module do not interfere in any way with the signal quality produced by the VCSEL. Also, while embodiments of the present invention are described in the context of a wide temperature range VCSEL module, it will be appreciated that the teachings of the present invention are applicable to other applications as well.

Semiconductor lasers, such as vertical cavity surface emitting lasers (VCSELs), often serve as light sources in optical networks. At a basic level, semiconductor lasers are essentially pn-junctions that convert electrical energy into light energy. Typically, a gain medium or active region is formed at the pn-junction between the p-type material and the n-type material. Often, the active region includes a gain medium such as a quantum well. The active region may also include quantum wires or dots. As light passes through the active region or gain medium, the light is amplified by stimulated emission. At certain frequencies or wavelengths, the semiconductor lasers lase and generate output light.

In vertical cavity surface emitting lasers, mirrors are usually formed both above and below the active region. The mirrors reflect light back and forth through the active region multiple times in an effort to generate stimulated emission. Within the VCSEL cavity that is effectively bounded by the mirrors or by this mirror system, the light resonates vertically or perpendicularly to the pn-junction and some light emerges from a surface of the VCSEL. Because the light is resonating vertically, the cavity length of a VCSEL is often very short with respect to the direction of light travel and the length of the cavity thus has an effect on the ability of a photon to produce additional photons through stimulated emission, particularly at low carrier densities. The mirrors increase the likelihood of a photon stimulating the emission of an additional photon. As previously indicated, the light emitted by VCSELs typically has multiple transverse modes or wavelengths.

FIG. 1 illustrates an example of a vertical cavity surface emitting laser 100 that is used in the present invention. The core of the VCSEL 100 is an active region 114 that includes quantum wells 112. The composition of the quantum wells is often related to the wavelengths that are generated by the VCSEL 100 and are typically formed from some combination of InGaAs or InGaAsP, although the present invention is not limited to these materials. For example, InGaP, AlGaAs, GaAs, InGaAs, and InGaAsP are often used in quantum wells that emit wavelengths of 650, 780, 850, 980, and 1300 nanometers, respectively. The composition of the quantum well has an impact on the band gap, which is related to the wavelengths or modes generated by the VCSEL 100.

VCSELs generally incorporate Distributed Bragg Reflector (DBR) layers as the mirror layers because of their high reflectivity properties. In the example of FIG. 1, the active region 114 is bounded by the upper DBR layers 110 and the lower DBR layers 116. One of the DBR layers includes n-type semiconductor materials and the other DBR layer includes p-type semiconductor materials. DBR layers are formed by forming or growing alternating layers of materials whose refractive index varies. Each individual DBR layer typically has a thickness of approximately λ/4. These alternating layers are often formed or grown from semiconductor materials or dielectric materials.

Light is reflected at the junction of the DBR layers, but in order to achieve the high reflectivity required by VCSELs, many layers must be formed or grown as previously discussed. The DBR layers 110 and 116 thus form mirror layers that reflect light through the active region 114. The aperture of the VCSEL 100 through which light is emitted is typically formed by oxidation of some of the DBR layers or ion implantation to form an aperture through which light can escape. Finally, the VCSEL 100 also includes a substrate 118 and metal contacts 120 and 106. The metal contacts 120 and 106 are used to inject electrical current into the active region 114 of the VCSEL 100.

Figure 2:
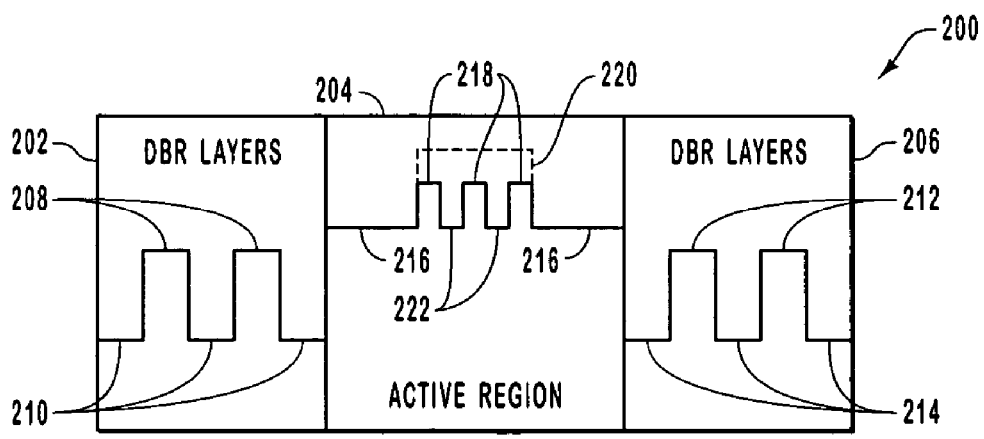
FIG. 2 illustrates the refractive indexes of the DBR layers and of the active region for the vertical cavity surface emitting laser shown in FIG. 1.

FIG. 2 is a block diagram that illustrates the refractive indices of the VCSEL layers of FIG. 1. Because the DBR layers are arranged in layer pairs, the DBR layers 202 have refractive indices that alternate between the indices 208 and 210. The DBR layers 206 are also arranged in pairs and have refractive indices that alternate between the indices 212 and 214. The refractive index 216 of the active region is usually higher than the refractive indices of the DBR layers 202 and 206. The quantum wells 220 within the active region 204 typically have refractive indices 218 that are higher than the indices 216 of the active region 204. Note that the quantum wells are usually separated by barrier layers whose refractive indices 222 are substantially the same as the indices 216.

Figure 3:
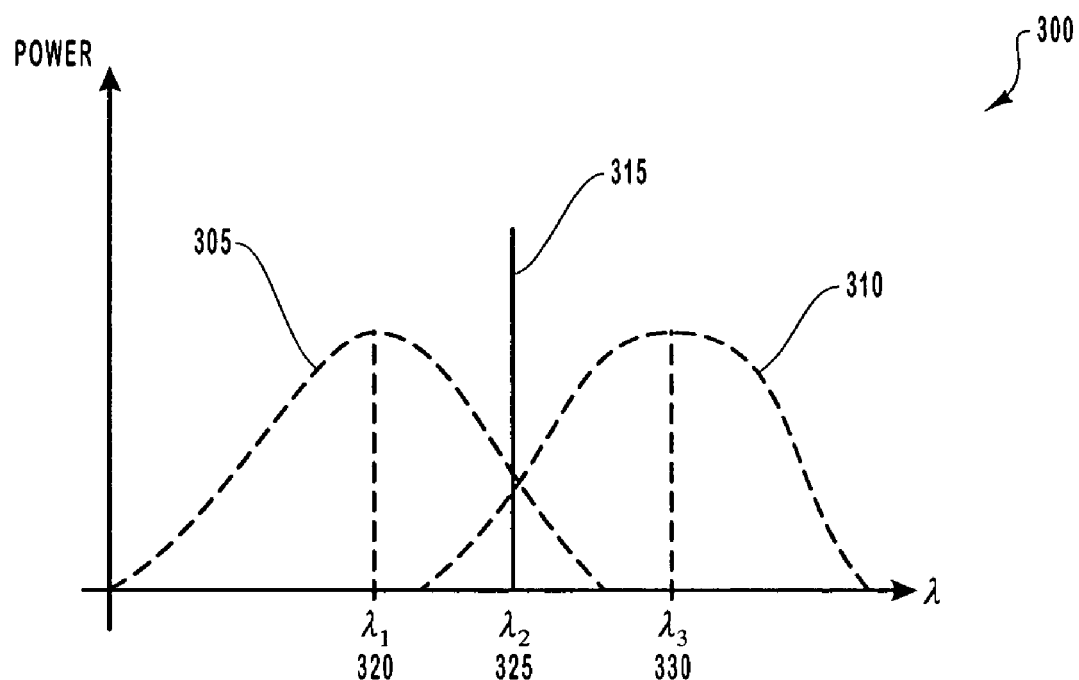
FIG. 3 illustrates an X-Y graph in which the x axis is wavelength and the y axis is power, wherein the graph illustrates a low temperature gain bandwidth curve, a high temperature gain bandwidth curve, and a cavity resonance point for a VCSEL tuned in accordance with the present invention.

Reference is next made to FIG. 3 which illustrates a low temperature gain bandwidth curve, a high temperature gain bandwidth curve, and a cavity resonance point for a VCSEL tuned in accordance with the present invention, designated generally at 300. The low temperature gain bandwidth curve 305 and the high temperature gain bandwidth curve 310 illustrate the power gain produced by light passing through the active region of the VCSEL in relation to wavelength. As the light bounces back and forth between the reflective layers, it passes through the active layer or region, which includes the quantum wells. The active region adds energy to the light in the process of stimulated emission which eventually causes the light to escape in the form of a laser. The active region and reflective layers are illustrated and described in more detail with reference to FIG. 1. The gain bandwidth curves 305 and 310 are a function of the composition of the active layer, the thickness of the active layer, the ambient temperature and the wavelength of light passing through the active layer. Therefore, the gain bandwidth curve of a VCSEL can be shifted or tuned by adjusting these variables. The illustrated low temperature gain bandwidth curve 305 and high temperature gain bandwidth curve 310 represent the same VCSEL at two different temperatures. In general, the gain bandwidth curve of a particular VCSEL is tuned by adjusting the thickness and composition of the active layer so as to position the peak of the gain bandwidth curve at a particular wavelength for a particular temperature.

With continued reference to FIG. 3, in the illustrated gain bandwidth curves 305, 310, the gain power peaks are positioned at wavelengths λ1 320 and λ3 330 respectively. The two gain bandwidth curves 305, 310 are shown to illustrate a low and high temperature range for efficient operation of the VCSEL tuned in accordance with embodiments of the present invention. A change in temperature shifts a gain bandwidth curve a certain amount. In order to tune the VCSEL in accordance with the present invention, a cavity resonance point 315 must be positioned in between a low temperature gain bandwidth curve 305 and a high temperature gain bandwidth curve 310. The cavity resonance point 315 is a function of the thickness of the cavity or the distance between the reflective layers. This distance can be seen in FIG. 1 as the distance between the furthest DBR layers. Optimal performance of a VCSEL is achieved when the cavity resonance point is aligned with the peak of a gain bandwidth curve. Like the gain bandwidth curves, the cavity resonance point is also affected by temperature. But, the response shift of the cavity resonance point in relation to temperature changes is different from the gain bandwidth curve. Therefore, when the temperature changes the gain bandwidth curve and the cavity resonance point shift by different amounts. To precisely tune the VCSEL for optimal performance at a particular high temperature, the cavity resonance point 315 should be intentionally offset from the gain bandwidth peak such that when the temperature increases to the desired optimal temperature, the cavity resonance point 315 will be aligned with the peak of the gain bandwidth curve. Likewise, in order to tune a VCSEL to operate over a particular temperature range, the cavity resonance point 315 must be positioned in between the low temperature gain bandwidth curve 305 peak and a high temperature gain bandwidth curve 310 peak as illustrated in FIG. 3. For example, if the high temperature gain bandwidth curve 310 peak λ1 320 represents the peak at 70 C and the low temperature gain bandwidth curve 305 peak λ3 330 represents the peak at 30 C., then the cavity resonance point 315 is positioned at a wavelength λ2 325 that is half way in between the λ1 320 and λ3 330. Alternatively, the cavity resonance point could be positioned at a wavelength that corresponds to the location of the gain bandwidth curve peak at 50 C. The distance between λ1 320 and λ3 330 and therefore the effective operational temperature range potential of a VCSEL is limited by the electrical current requirements. In operation, the further the gain bandwidth curve peak is from the cavity resonance point, the more current is required to drive the light from a particular low energy state into a higher energy laser state that is necessary for operation.

Figure 4:
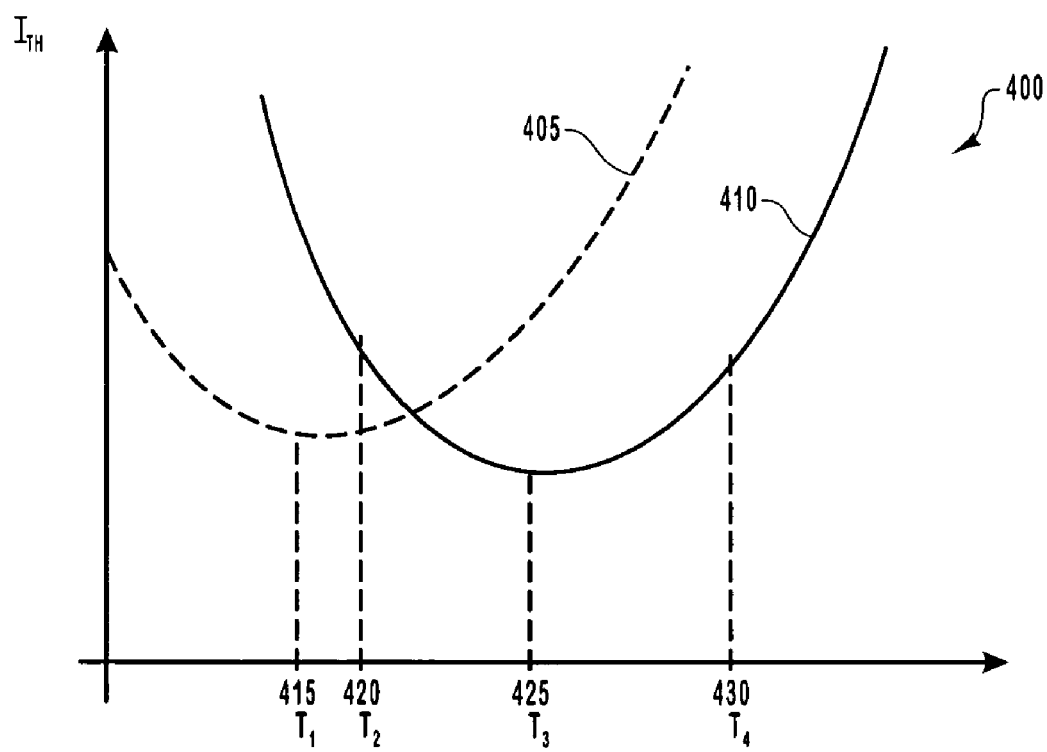
FIG. 4 illustrates an X-Y graph in which the x axis is temperature and the y axis is threshold current, wherein the graph illustrates a threshold current curve for a conventional VCSEL and a threshold current curve for a VCSEL tuned in accordance with the present invention.

Reference is next made to FIG. 4 which illustrates a threshold current curve for a conventional VCSEL and a threshold current curve for a VCSEL tuned in accordance with embodiments of the present invention, designated generally at 400. The threshold current is the current that is required to raise the energy level of the incoming light to an excited laser state. The threshold current curve 405 for a conventional VCSEL and the threshold current curve 410 for a VCSEL tuned in accordance with embodiments of the present invention illustrate the logarithmic nature of the threshold current in relation to the operational temperature. Both of the threshold curves 405, 410 have a point at which the current requirement for the VCSEL is minimized; this point is generally referred to as the particular VCSEL's optimal temperature. The further the temperature is away from the optimal temperature, the more current is required to drive the laser. The optimal temperature for any VCSEL corresponds to a temperature at which the cavity resonance wavelength is aligned with the gain bandwidth peak wavelength. For example, in the conventional threshold current curve 405, the optimal temperature is at temperature T1 415. In general, conventional VCSELs are tuned to operate with a lowest current requirement or optimal temperature at room temperature, such as 30 C. Whereas, the VCSEL tuned in accordance with embodiments of the present invention is tuned to operate with a optimal temperature T3 425, which is generally higher than room temperature. Temperatures T2 420 and T4 430 represent the low and high temperature range extremes within which the VCSEL can operate effectively. These temperatures correspond to the operational temperature for the low temperature gain bandwidth curve 305 and high temperature gain bandwidth curve 310 illustrated in FIG. 3. The VCSEL is therefore tuned for a higher operational temperature to allow the VCSEL to operate efficiently at higher temperatures. The VCSEL module of the present invention includes a heater and a temperature sensor that are designed to raise the operational temperature when it is below a particular value. The components of the VCSEL module are described in more detail below.

Designing the VCSEL such that the optimal temperature is higher than is actually necessary is counter intuitive because it will likely require a threshold current that is higher than a VCSEL that is designed for a lower optimal temperature. The advantage gained, however, occurs as the temperature increases. At higher temperatures, the VCSEL whose optimal temperature is the lowest will require more current that the VCSEL that was initially configured for higher temperatures. For instance, at T3 425, the threshold current of the laser associated with the current curve 405 is higher than the threshold current of the laser associated with the current curve 410. In this manner, a VCSEL can be configured to accommodate higher operating temperatures.

Figure 5:
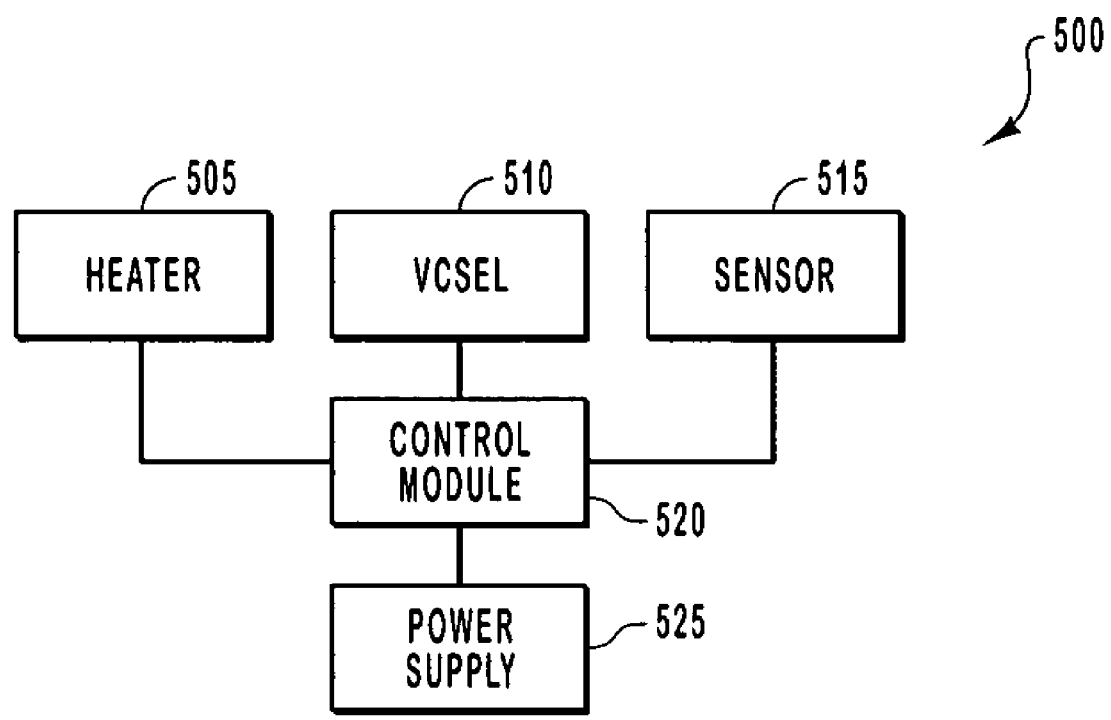
FIG. 5 illustrates a functional block diagram of the components of a wide temperature range VCSEL module in accordance with one embodiment of the present invention.

Reference is next made to FIG. 5 which illustrates a functional block diagram of the components of a wide temperature range VCSEL module in accordance with one embodiment of the present invention, designated generally at 500. The VCSEL module further includes a heater 505, a VCSEL 510, a sensor 515, a control module 520, and a power supply 525. The VCSEL 510 is tuned in accordance with the present invention to have an optimal operating temperature higher than room temperature as described in more detail with reference to FIGS. 3 and 4. The sensor 515 is designed to sense a temperature and notify the control module when the temperature drops below or above a particular temperature value. The position of the sensor in relation to the VCSEL will determine the temperature at which the sensor notifies the control module. For example, the sensor may be positioned to measure the operational temperature of the VCSEL which may be different from the air temperature around the VCSEL. The sensor is an electrical or optical component such as a thermistor that changes its electrical properties in relation to temperature. The heater 505 is an electrical heating element that generates heat causing the surrounding temperature to increase. A heater could simply be a resistor that is positioned in an electrical circuit such that it generates heat when current is passed through it. The position of the heater 505 in relation to the VCSEL 510 determines how much heat the heater 505 can safely generate without interfering with the operation of the VCSEL 510. The heater 505 is also electrically connected to the control module.

The temperature at which the heater 505 is activated can be determined in a number of ways. For example, the temperature can be determined using the optimal operating temperature as a reference. Alternatively, the activation temperature can be predetermined and not dependent on the optimal operating temperature of the laser. Alternatively, the activation temperature of the beater 505 can be determined from the current curve of the VCSEL such that the threshold current is not excessive.

With continued reference to FIG. 5, the control module 520 is connected to the heater 505, the VCSEL 510, the sensor 515 and the power supply 525. The control module 520 independently powers the VCSEL 510 and the heater 505 from the power supply 525. When the control module 520 determines that the sensor 515 senses that the temperature is below a particular temperature, the control module 520 sends power to or turns on the heater to begin heating the air. When the sensor 515 senses that the temperature is once again above the particular temperature, the control module 520 cuts off the power or turns off the heater. This process ensures that the temperature is always at least the lowest operational temperature required to operate the VCSEL 510 or that the VCSEL 510 is at a temperature that does not require potentially harmful threshold current. Alternatively, the particular temperature can be adjusted so that the heater maintains a temperature level at approximately the optimal temperature value for the VCSEL 510. The additional energy required to heat the air can be compared to the additional energy required to drive the VCSEL 510 when it is not at the optimal temperature to determine which requires less energy. The control module 520 supplies the current to the VCSEL 510 that is necessary for laser operation. As illustrated in FIG. 4, the current requirements of the VCSEL 510 are also a function of temperature. Additional feedback or precision temperature elements can be added to enable the control module 520 to supply only the required current to the VCSEL 510.

The components of the VCSEL module 500 can be electrically connected and positioned in numerous ways to conform to various size and temperature constraints. For example, the components could be positioned on a small portion of an existing printed circuit board. In addition, the control module 520 could be a microprocessor that also performs other functions in a particular electrical circuit. Alternatively, the various components of the VCSEL module 500 could be incorporated on a TO can for use in optical applications. These and other physical implementations of the VCSEL module are contemplated for various applications.

In summary, the VCSEL module of the present invention is configured to operate in a wide range of temperatures. The individual VCSEL within the VCSEL module is tuned to operate at a higher than normal optimal temperature. The actual range of temperatures at which the VCSEL itself can operate does not change. But, in addition to tuning the VCSEL to higher temperatures, the VCSEL module includes a heater and a sensor that are configured to heat the air up to a temperature within the temperature range of the VCSEL. Therefore, by combining the heating ability of the heater and the counterintuitive concept of tuning the VCSEL to a higher optimal operating temperature, the VCSEL module is able to operate over a wide temperature range.

The VCSEL module of the present invention has advantages over conventional VCSELs in that it can operate over a wide range of temperatures. This allows the VCSEL module to be used in environments that do not have regulated temperatures such as outside or in a non-temperature regulated building. In addition the VCSEL module could be used to replace existing VCSELs to provide additional safeguards over data integrity. For example, in an optical networking environment a VCSEL may be used in order to convert electrical data signals into optical data signals. If the VCSEL is positioned in a temperature regulated building that occasionally shuts down the heating and cooling, there is a potential for the performance of the VCSEL to be affected. Likewise, if any electrical or optical components near the VCSEL malfunction and produce excess heat there is a potential for data to be corrupted. Therefore, a VCSEL module that is configured to operate over a wide temperature range could be used to replace a standard VCSEL to provide an additional data integrity safeguard.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A vertical cavity surface emitting laser (VCSEL) module, comprising:
    a VCSEL;
    a temperature sensor configured to sense an operating temperature of the VCSEL;
    a heating element in thermal communication with the VCSEL; and
    a control module in communication with the temperature sensor and operably connected with the heating element and with the VCSEL, and the control module configured to operate in:
        a first operational mode where a change in operating temperature of the VCSEL is associated with a VCSEL operating current output of the control module; and
        a second operational mode where a change in operating temperature of the VCSEL is associated with a heating element control output of the control module, the heating element control output corresponding with a thermal output of the heating element;
    wherein a drop in VCSEL operating temperature below an activation temperature is associated with either:
        a corresponding relative increase in the VCSEL operating current output of the control module; or
        a corresponding change in a heating element control output of the control module; and
    wherein the control module is configured to operate in whichever operational mode requires the least amount of energy, relative to the other operational mode.

2. A module as defined in claim 1, wherein at the predetermined operating temperature, a cavity resonance point of the vertical cavity surface emitting laser is substantially aligned with a gain bandwidth peak of the vertical cavity surface emitting laser.

3. A module as defined in claim 1, wherein the temperature sensor comprises a thermistor.

4. A module as defined in claim 1, wherein the heating element comprises a resistor.

5. A module as defined in claim 1, wherein the predetermined operating temperature is greater than 30 degrees Celsius.

6. A module as defined in claim 1, wherein the predetermined operating temperature is greater than about 50 degrees Celsius.

7. A module as defined in claim 1, wherein the predetermined operating temperature is about 70 degrees Celsius.

8. A module as defined in claim 1, wherein the control module turns the heating element off when the operating temperature exceeds the predetermined operating temperature.

* * * * *

UNITED STATES PATENT AND TRADEMARK OFFICE
CERTIFICATE OF CORRECTION

PATENT NO. : 7,356,057 B2  Page 1 of 2
APPLICATION NO. : 10/695057
DATED : April 8, 2008
INVENTOR(S) : Deng et al.

It is certified that error appears in the above-identified patent and that said Letters Patent is hereby corrected as shown below:

On the Title Page
Item 56, References Cited, Other Publications, Publication 4, change "R.A. Morgank" to --R.A. Morgan--
Item 56, References Cited, Other Publications, Publication 5, change "Cryogenic Operation of AlGaAs-GaAs Vertical-Cavity Surface-Emitting Lasers at Temperatures from 200K to 6 K," to --"Cryogenic Operation of AlGaAs-GaAs Vertical-Cavity Surface-Emitting Lasers at Temperatures from 200K to 6 K,"--

Column 4
Line 54, after "quantum wells", add [112]
Line 62, change "quantum well" to --quantum wells 112--

Column 5
Line 14, after "aperture", add [104]
Line 16, after "layers", add [108]
Line 22, after "diagram", add [200]
Line 28, after "active region", add [204]
Line 33, after "wells", add [220]

Column 6
Line 38, change "330 and" to --330, and--
Line 40, change "VCSEL" to --VCSEL,--

Column 7
Line 45, after "sensor", add [515]
Line 46, after "VCSEL", add [510]
Line 47, after "sensor", add [515]
Line 47, after "module", add [520]
Line 48, after "sensor", add [515]
Line 49, after "VCSEL", add [510]
Line 50, change "VCSEL. The sensor" to --VCSEL 510. The sensor 515--
Line 61, after "module" add [520]

Signed and Sealed this

Tenth Day of August, 2010

David J. Kappos
*Director of the United States Patent and Trademark Office*

Column 8
Line 1, change "beater" to --heater--
Line 2, after "VCSEL", add [510]
Line 11, after "heater", add [505]
Line 14, after "heater", add [505]
Line 20, after "heater", add [505]
Line 42, after "module" add [500]